United States Patent [19]

Sasaki

[11] Patent Number: 4,994,728
[45] Date of Patent: Feb. 19, 1991

[54] APPARATUS FOR DIAGNOSING VEHICLE-MOUNTED BATTERY

[75] Inventor: Katsuhiro Sasaki, Himeji, Japan

[73] Assignee: Mitsubishi Denki Kabushiki Kaisha, Tokyo, Japan

[21] Appl. No.: 314,743

[22] Filed: Feb. 24, 1989

[30] Foreign Application Priority Data

Feb. 24, 1988 [JP] Japan .................................. 63-41076

[51] Int. Cl.⁵ ............................................ G01R 31/36
[52] U.S. Cl. ...................................... 320/48; 324/427; 324/429
[58] Field of Search ...................... 320/43, 48; 324/426, 324/427, 429, 430, 431, 432, 433; 340/636

[56] References Cited

U.S. PATENT DOCUMENTS

| | | | |
|---|---|---|---|
| 3,997,888 | 12/1976 | Kremer | 324/426 X |
| 4,025,916 | 5/1977 | Arnold et al. | 320/48 X |
| 4,553,140 | 11/1985 | Maida | 340/636 |
| 4,608,714 | 8/1986 | Juengel | 320/48 X |
| 4,719,427 | 1/1988 | Morishita et al. | 324/427 |
| 4,725,784 | 2/1988 | Peled et al. | 324/427 |

FOREIGN PATENT DOCUMENTS

| | | |
|---|---|---|
| 0110466 | 11/1983 | European Pat. Off. . |
| 0206503 | 5/1986 | European Pat. Off. . |
| 2043660 | 9/1970 | Fed. Rep. of Germany . |
| 0156871 | 9/1983 | Japan .................. 324/426 |
| 0008766 | 1/1985 | Japan .................. 324/429 |
| 2126735 | 8/1983 | United Kingdom . |
| 2176902 | 1/1987 | United Kingdom . |

Primary Examiner—Steven L. Stephan
Assistant Examiner—Kristine L. Peckman
Attorney, Agent, or Firm—Sughrue, Mion, Zinn, Macpeak & Seas

[57] ABSTRACT

An apparatus for diagnosing the residual charge of a battery mounted in a vehicle which utilizes an engine includes a comparator for comparing the terminal voltage of the battery with a reference voltage, a stoppage detecting circuit for detecting that the operation of the engine has stopped, a timer for determining that a predetermined time has elapsed since the stoppage detecting circuit detected that the operation of the engine stopped, and a determination circuit for determining the residual charge of the battery from the comparison result provided by the comparator when the timer determined that the predetermined time has elapsed.

8 Claims, 1 Drawing Sheet

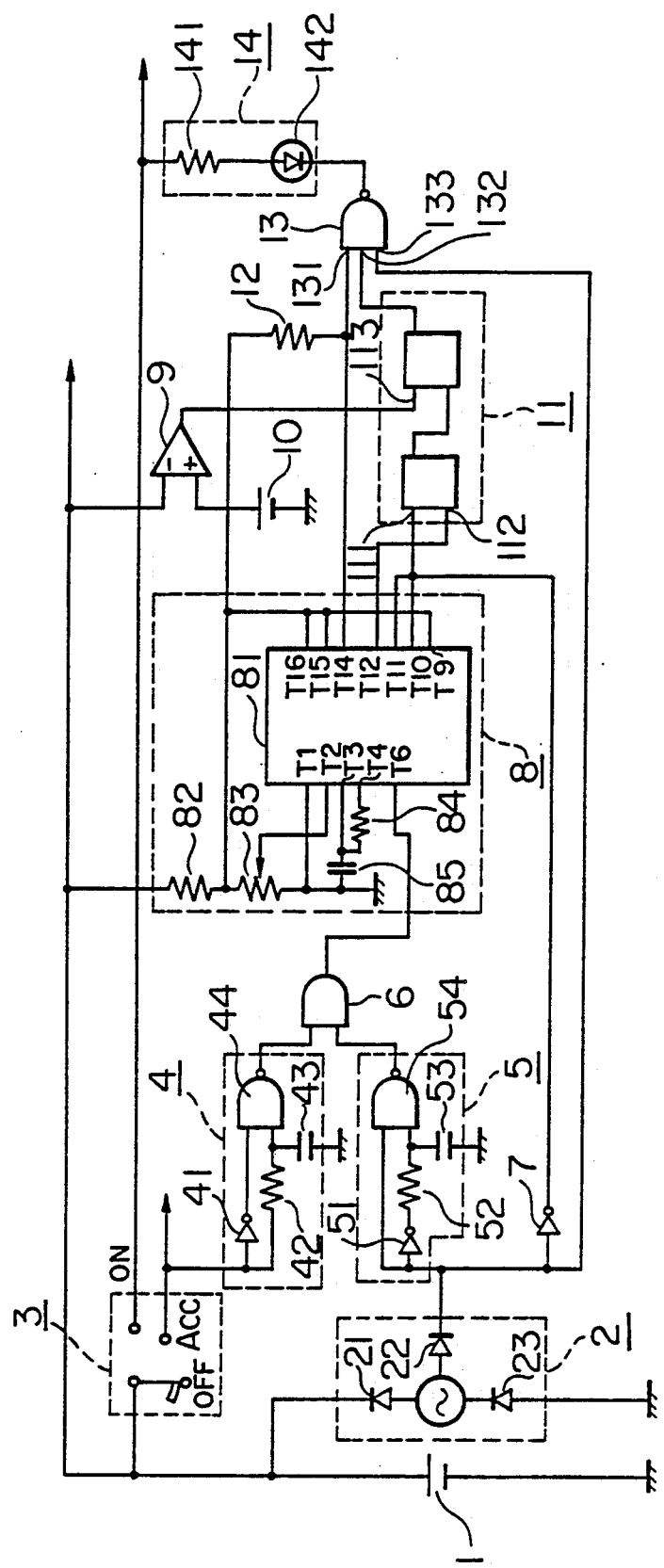

APPARATUS FOR DIAGNOSING VEHICLE-MOUNTED BATTERY

BACKGROUND OF THE INVENTION

1. Field of the Invention

The present invention relates to an apparatus for diagnosing the residual charge of a battery, for example, one mounted in a vehicle such as an automobile.

2. Description of the Related Art

In the conventional techniques for determining the residual charge of a battery mounted in a vehicle, the terminal voltage, the internal resistance, or the specific gravity of the electrolyte of the battery is measured, and the measured value of one of these factors is utilized to determine the residual charge of the battery. Such conventional residual charge determining techniques are disclosed in, for example, the specification of Japanese Patent Laid-Open No. 55-58739.

However, since the internal resistance of the battery and the specific gravity of the electrolyte change with the passage of time, the results obtained utilizing either of these factors may vary due to the time during which the battery has been used or the condition in which that battery is used.

The residual charge of a battery may be determined relatively easily and accurately by measuring the terminal voltage of the battery. However, the terminal voltage of a battery may be accurately correlated with the residual charge only in states where the battery has not been affected by charging or discharging and where a sufficient time has elapsed since the last charging or discharging so that the effect of the chemical action of the electrolyte caused by the charging or discharging of the battery can be ignored.

Thus, the terminal voltage of the battery must be measured only after the lapse of a certain time from the time when the operation of the engine has stopped and the battery has been disconnected from the load. However, it is a troublesome task for a driver to measure the passage of a certain time, measure the battery terminal voltage after a certain time has elapsed, and determine the residual charge of the battery utilizing the measured value.

Further, if the terminal voltage of the battery is measured immediately before the engine is restarted, it may be impossible to obtain an accurate determination result of the residual charge of the battery because the time the engine has been stopped may vary and the battery may be still under the influence of the chemical action of the electrolyte.

SUMMARY OF THE INVENTION

The present invention is directed to obviating the above-described problems of the conventional battery diagnosing techniques and has for its object to provide a battery diagnosing apparatus which is capable of readily diagnosing the residual charge of a battery with a high degree of accuracy.

To this end, the present invention provides an apparatus for diagnosing the residual charge of a battery for use with an engine, the apparatus comprising: a comparison means for comparing the terminal voltage of the battery with a reference voltage; a stoppage detection means for detecting that the operation of the engine has stopped; a timer means for determining that a predetermined time has elapsed since the stoppage detection means detected that the operation of the engine stopped; and a determination means for determining the residual charge of the battery from the comparison result provided by the comparison means when the timer means determined that the predetermined time has elapsed.

BRIEF DESCRIPTION OF THE DRAWINGS

The sole figure is a circuit diagram of a vehiclemounted battery diagnosing apparatus showing an embodiment of the present invention.

DESCRIPTION OF THE PREFERRED EMBODIMENT

An embodiment of the present invention will be described below with reference to the accompanying drawing.

In the figure, an a.c. generator 2 is parallel-connected to a vehicle-mounted battery 1 to charge the vehicle-mounted battery 1 and to supply power to an electric load in the vehicle (not shown). The a.c. generator 2 has a main rectifying output terminal 21, an auxiliary output terminal 22 and an earth terminal 23. An OFF terminal of a key switch 3 is connected to the positive terminal of the vehicle-mounted battery 1.

An input terminal of an inverter 41 and one end of a resistor 42 are connected to an ACC terminal of the key switch 3. An output terminal of the inverter 41 and the other end of the resistor 42 are connected to first and second input terminals of a NAND gate 44, respectively. Also, said other end of the resistor 42 is grounded through a capacitor 43. The inverter 41, the resistor 42, the capacitor 43 and the NAND gate 44 in combination form a stoppage detecting circuit 4. This stoppage detecting circuit 4 is a one-shot trigger circuit which produces one triggering signal when the key switch 3 is changed over from the ACC terminal to the OFF terminal.

An input terminal of an inverter 51 and a first input terminal of an NAND gate 54 are connected to the auxiliary output terminal 22 of the a.c. generator 2, and an output terminal of the inverter 51 is connected to a second input terminal of the NAND gate 54 through a resistor 52. Also, the second input terminal of the NAND gate 54 is grounded through a capacitor 53. The inverter 51, the resistor 52, the capacitor 53 and the NAND gate 54 together form a restart detecting circuit 5. This restart detecting circuit 5 is a one-shot trigger circuit, like the stoppage detecting circuit 4, and produces one triggering signal when the auxiliary output terminal 22 of the a.c. generator 2 rises from low level to high level.

An output terminal of the NAND gate 44 of the stoppage detecting circuit 4 and that of the NAND gate 54 of the restart detecting circuit 5 are respectively connected to first and second input terminals of an AND gate 6. An output terminal of the AND gate 6 is connected to a terminal T6 of an IC 81 incorporated in a timer circuit 8.

The IC 81 is a programmable CR timer/divider IC with a Zener diode incorporated to supply power thereto, which may be TC5043P manufactured by Toshiba Corporation. A resistor 82 for supplying bias current to the Zener diode in the IC 81 and a resistor 83 used to finely adjust the oscillation frequency are connected in series between the positive terminal of the vehicle-mounted battery 1 and the earth. The connecting point of the resistors 82 and 83 is connected to terminals T9, T15 and T16 of the IC 81 and to a terminal T14 of the IC 81 through a pull-up resistor 12. A terminal T1 of the IC 81 is grounded, and a terminal T2 is connected to a movable terminal of the resistor 83. Further, a resistor 84 is connected between terminals T3 and T4 of the IC 81, and the terminal T3 is grounded through a capacitor 85. Terminals T10 and T11 of the IC 81 are connected to the auxiliary output terminal 22 of the a.c. generator 2 through an inverter 7.

The terminal T6 of the IC 81 is a resetting and starting terminal Once a triggering signal is input to this terminal T6, a counter in the IC 81 is reset, and measurement of the time duration is started. The terminals T9 to T11 are terminals used to set the dividing ratio of the IC 81, i.e., the time duration measured by the timer. A maximum time duration that can be measured by the timer is set when high level signals are input to these three terminals T9 to T11. Once the time duration set by the terminals T9 to T11 has elapsed, a timeout signal is delivered from a terminal T12. After the resetting signal has been input to the terminal T6, the IC 81 delivers at the terminal T14 a rectangular signal which alternately assumes high and low levels for the time duration determined by the dividing ratio set until that time set for the timer elapses.

The IC 81, the resistors 82 through 84, and the capacitor 85 in combination form a timer circuit 8 with a power circuit incorporated therein.

The positive terminal of the vehicle-mounted battery 1 is connected to a negative input terminal of a comparator 9, and a reference power source 10 is connected to a positive input terminal of the comparator 9. The comparator 9 compares a voltage V of the vehicle-mounted battery 1 with a voltage $v_0$ of the reference power source 10, and produces a low level signal when $V > V_0$ and a high level signal when $V \leq V_0$. The output terminal of the inverter 7, the time up output terminal T12 of the IC 81 and the output terminal of the comparator 9 are respectively connected to first, second, and third input terminals 111, 112 and 113 of a D type flip-flop 11. This flip-flop 11 holds the level of the signal existing at the third input terminal 113 when high level signals are respectively input to the first and second input terminals 111 and 112, and delivers that signal.

The terminal T14 of the IC 81, the output terminal of the flip-flop 11 and the auxiliary output terminal 22 of the a.c. generator 2 are respectively connected to first, second, and third input terminals 131, 132 and 133 of an NAND gate 13. An emergency indicating circuit 14 including a series combination of a resistor 141 and a light-emitting diode 142 is connected between an ON terminal of the key switch 3 and an output terminal of the NAND gate 13.

Next, the operation of this embodiment will be described.

First, during the operation of the engine (not shown) of the vehicle, the key switch 3 is at the ON terminal, and the auxiliary output terminal 22 of the a.c. generator 2 driven by the engine is at a logic high level.

Once the key switch 3 is turned to the ACC terminal, the operation of the engine stops and hence the operation of the a.c. generator 2 also stops. This causes the voltage value at the auxiliary output terminal 22 of the a.c. generator 2 to be reduced to the earth potential or low level.

When the key switch 3 is further turned from the ACC terminal to the OFF terminal and the ACC terminal is thereby disconnected from the vehicle-mounted battery 1, the stoppage detecting circuit 4 delivers one lorogoing triggering signal to the AND gate 6. Upon receipt of this triggering signal to the terminal T6 of the IC 81 from the AND gate 6, the counter in the IC 81 is reset and measurement of the time duration is started. Since the auxiliary output terminal 22 of the a.c. generator 2 is at a logic low level at this time, the terminals T10 and T11 of the IC 81 connected to the output terminal of the inverter 7 are at a logic high level. Further, since the terminal T9 of the IC 81 is connected to the positive pole of the vehicle-mounted battery 1 through the resistor 82, it is also at a logic high level. These cause the maximum time duration to be set in the IC 81.

After the time duration set for the timer has elapsed, the IC 81 delivers a timeout signal having a high level to the second input terminal 112 of the flip-flop 11 at the terminal T12. Since the first input terminal 111 of the flip-flop 11 connected to the output terminal of the inverter 7 is at a logic high level at this time, the level of the signal output from the comparator 9 to the third input terminal 113 of the flip-flop 11 is held in the flip-flop 11, and is delivered to the NAND gate 13. More specifically, when the terminal voltage V of the vehicle-mounted battery 1 obtained when the time duration set for the timer has elapsed is higher than the voltage $V_0$ of the reference power source 10, the flip-flop 11 delivers logic low level signal to the second input terminal 132 of the NAND gate 13. It delivers a logic high level signal when the terminal voltage V is equal to or lower than the voltage $V_0$. However, since the third input terminal 133 of the NAND gate 13 connected to the auxiliary output terminal 22 of the a.c. generator 2 is at a logic low level, the NAND gate 13 produces a logic high level regardless of the level of the signal present on the second input terminal 132 of the NAND gate 13.

Once the key switch 3 is turned from the OFF terminal to the ON terminal through the ACC terminal so as to restart the engine, the level of the auxiliary output terminal 22 of the a.c. generator 2 driven by the engine rises. This causes the restart detecting circuit 5 to deliver one lorogoing triggering signal to the AND gate 6. Upon receipt of this triggering signal at the terminal T6 of the IC 81 through the AND gate 6, the counter in the IC 81 is reset, and the measurement of the time duration is started. It is to be noted that since the auxiliary output terminal 22 of the a.c. generator 2 is at a logic high level at this time, signals having a low level are supplied to the terminals T10 and T11 of the IC 81 connected to the output terminal of the inverter 7 to reduce the dividing ratio of the IC 81 and reduce the time duration set for the timer to several minutes. As the measurement of the time is started in the IC 81, the IC 81 delivers a rectangular signal to the first input terminal 131 of the NAND gate 13 from the terminal T14.

At this time, a signal having a logic high level is supplied from the auxiliary output terminal 22 of the a.c. generator 2 to the third input terminal 133 of the NAND gate 13. Hence, if the signal delivered from the flip-flop 11 to the second input terminal 132 of the NAND gate 13 has a logic high level, i.e., if the terminal voltage V of the vehicle-mounted battery 1 is equal to or lower than the voltage $V_0$ of the reference power source 10, the NAND gate 13 produces a signal which alternately assumes one of high and low levels at time intervals corresponding to the period of the rectangular signal output from the terminal T14 of the IC 81. Since current flows from the positive pole of the vehicle-mounted battery 1 to the light-emitting diode 142 of the emergency indicating circuit 14 through the resistor 141 only when the signal output from the NAND gate 13 assumes a logic low level, the light emitting diode 142 turns on and off at the aforementioned time intervals so as to warn the driver of the vehicle that the residual charge of the battery 1 is short. The flashing of the light-emitting diode 142 continues until the time duration set in the IC 81 elapses and the output of the rectangular signal from the terminal T14 stops.

If the signal delivered from the flip-flop 11 to the second input terminal 132 of the NAND gate 13 is a logic low level signal, i.e., if the terminal voltage V of the vehicle-mounted battery 1 is higher than the voltage $V_0$ of the reference power source 10, the NAND gate 13 produces a signal which constantly assumes a logic high level, so the light-emitting diode 142 does not light up.

Thus, in this embodiment, the terminal voltage of the vehicle-mounted battery 1 is measured in the state wherein the predetermined time has elapsed since the engine stopped and wherein the effect of the chemical action of the vehicle-mounted battery 1 can be ignored, and a warning is issued to the driver if the measured value is lower than the reference value, which means that the residual charge of the battery 1 is short.

In the above-described embodiment, the emergency indicating circuit 14 sends out a warning to the driver by flashing the light-emitting diode 142. However, the warning may be done by lighting the light-emitting diode 142 for a predetermined time. It may also be done by making a warning sound.

Further, in the aforementioned embodiment, the time duration that the light-emitting diode 142 is turned on and off is controlled by the IC 81. However, means for measuring time during which the warning is to be issued may be incorporated in the emergency indicating circuit 14.

In this embodiment, since the measurement of the terminal voltage of the vehicle-mounted battery 1 is conducted in a state wherein the effect of charging or discharging of the battery 1 or the effect of the chemical action of the battery 1 can be ignored, power is directly supplied to the diagnosing apparatus from the vehiclemounted battery 1. More accurate diagnosis of the residual charge of the battery 1 may be therefore possible if the current consumption of the diagnosing apparatus is reduced by the construction of the diagnosing apparatus by a CMOS integrated circuit

What is claimed is:

1. An apparatus for diagnosing the residual charge of a battery for use with an engine, comprising:
    a comparison means for comparing the terminal voltage of a battery with a reference voltage;
    a stoppage detection means for detecting that the operation of an engine has stopped;
    a timer means for determining that a predetermined time has elapsed since said stoppage detection means detected that the operation of said engine stopped;
    a determination means for determining said residual charge of said battery from the comparison result provided by said comparison means when said timer means determined that the predetermined time has elapsed;
    a holding means for holding the determination result of said determination means;
    restart detection means for detecting that said engine has restarted; and
    determination result outputting means for outputting the determination result held in said holding means when said restart detection means detects that said engine has restarted.

2. A battery diagnosing apparatus according to claim 1, wherein said predetermined time determined by said timer means is a time required for said battery to become stable so that the effect of the chemical action thereof can be ignored.

3. A battery diagnosing apparatus according to claim 1, further comprising a key switch connected to said battery, said key switch being used to start and stop the operation of said engine, said stoppage detection means detecting that said engine has stopped on the basis of the state of said key switch.

4. A battery diagnosing apparatus according to claim 1, wherein said timer means is a timer IC.

5. A battery diagnosing apparatus according to claim 1, wherein said comparison means is a comparator.

6. A battery diagnosing apparatus according to claim 1, wherein said determination means is a D-type flip-flop.

7. A battery diagnosing apparatus according to claim 1, wherein said determination result outputting means issues a warning to an operator of said engine when said determination result indicates that said residual charge of said battery is short.

8. A battery diagnosing apparatus according to claim 7, wherein said determination result outputting means blinks for warning.

* * * * *